(12) United States Patent
Ikeda

(10) Patent No.: US 7,547,628 B2
(45) Date of Patent: Jun. 16, 2009

(54) METHOD FOR MANUFACTURING CAPACITOR

(75) Inventor: Noriaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 157 days.

(21) Appl. No.: 11/598,036

(22) Filed: Nov. 13, 2006

(65) Prior Publication Data

US 2007/0111434 A1 May 17, 2007

(30) Foreign Application Priority Data

Nov. 14, 2005 (JP) ............................. 2005-328996

(51) Int. Cl.
*H01L 21/4763* (2006.01)
(52) U.S. Cl. .................. 438/637; 438/672; 438/675; 438/700; 257/E21.577; 257/E21.585
(58) Field of Classification Search ................ 438/746, 438/757
See application file for complete search history.

(56) References Cited

U.S. PATENT DOCUMENTS

2003/0162353 A1* 8/2003 Park .......................... 438/253

2007/0123040 A1* 5/2007 Hwang et al. ............... 438/672

FOREIGN PATENT DOCUMENTS

JP 11-26712 1/1999

* cited by examiner

*Primary Examiner*—Walter L Lindsay, Jr.
*Assistant Examiner*—Cheung Lee
(74) *Attorney, Agent, or Firm*—McGinn IP Law Group, PLLC

(57) ABSTRACT

A method for manufacturing a capacitor includes depositing an interlayer insulating film on or above a plug connected to a switching element, forming a hole in the interlayer insulating film such that the opening portion of the hole is surrounded by an overhang structure and that the plug is exposed in the bottom of the hole, removing the overhang structure, forming a lower electrode on the inner surface of the deep hole, forming a dielectric on the lower electrode, and forming an upper electrode on the dielectric. The above steps prevent the formation of a gap in the capacitor, since the overhang structure as a cause of the gap is removed. The coverage by the dielectric is also prevented from being poor.

9 Claims, 14 Drawing Sheets

METHOD FOR MANUFACTURING CAPACITOR

BACKGROUND OF THE INVENTION

1. Field of the Invention

The present invention relates to a method for manufacturing a capacitor, and in particular, relates to a method for manufacturing a stacked capacitor for a dynamic random access memory (DRAM).

2. Description of the Related Art

Referring to FIGS. 1 and 2, a conventional method for manufacturing a stacked capacitor for a DRAM will be explained. The stacked capacitor is provided in a deep hole. The DRAM generally includes a memory cell array and a peripheral circuit region. FIG. 1 is a cross sectional view of a memory unit 100 of the conventional DRAM. The memory unit 100 includes two memory cells. A plurality of the memory unit 100 is arranged in a matrix array to form the memory cell array. The peripheral circuit region is provided in adjacent to the memory unit 100 via an element separation region 104. In the following explanation, explanation of the peripheral circuit region will be omitted.

The conventional memory unit 100 includes a switch portion 10, which includes two switching transistors, and a capacitor portion 20, which includes two stacked capacitors. The switch portion 10, which is provided on a p-type silicon substrate 101, includes an n-well 102, p-well 103 and the element separation region 104. The n-well 102 is provided on the p-type silicon substrate 101. The p-well 103 is provided on the n-well 102. The element separation region 104 is provided on the n-well 102 to be arranged in adjacent to the p-well 103. Another memory unit or the peripheral circuit region is provided in adjacent to the memory unit 100 via the element separation region 104.

The switching transistors are provided in the p-well 103. The switching transistors share a source 107 connected to a bit line 113. Each of the switching transistors includes a drain 106 and a gate electrode 109 as a word line. The drain 106 is connected to the capacitor portion 20. A gate insulating film is provided between the drain 106 and gate electrode 109. The gate electrode 109 has a polycide structure, in which a tungsten silicide film is stacked on a polycrystalline silicon film, or a polymetal structure, in which a tungsten film is stacked on a polycrystalline silicon film.

A first interlayer insulating film 114 is provided on the switching transistors (switching element). In the predetermined region of the first interlayer insulating film 114, there is provided a bit-line contact 112 to connect the source 107 and the bit line 113. The bit-line contact 112 is composed of polycrystalline silicon, titanium silicide, titanium nitride and tungsten films filled in a contact hole provided in the first interlayer insulating film 114. The bit line 113 is provided on the first interlayer insulating film 114. The bit line 113 is composed of tungsten nitride and tungsten films. For each drain 106, a contact 111 is provided in a predetermined region of the first interlayer insulating film 114. Each contact 111 is connected to each drain 106.

A second interlayer insulating film 201 is provided on the bit line 113 and the first interlayer insulating film 114. For each contact 111, a silicon plug 202 is provided in the second interlayer insulating film 201. Each silicon plug 202 is connected to each contact 111.

A silicon nitride film 203 is provided on the second interlayer insulating film 201. A third interlayer insulating film 204 is provided on the silicon nitride film 203. For each silicon plug 202, a deep hole is provided in a predetermined region of the silicon nitride film 203 and the third interlayer insulating film 204. For each deep hole, a lower electrode 205 is provided on the inner surface of the deep hole. Each lower electrode 205 is connected to each silicon plug 202. A dielectric 206 is provided on third interlayer insulating film 204 and each lower electrode 205. An upper electrode 207 is provided on the dielectric 206. Each of the capacitors, which include the lower electrode 205, dielectric 206 and upper electrode 207, is arranged in each deep hole in the silicon nitride film 203 and the third interlayer insulating film 204. The capacitors are stacked capacitors provided in the deep holes. An insulating film 401 is provided on the upper electrode 207. On the insulating film 401, provided is a wiring layer 402 composed of a titanium nitride film, an aluminum film and a titanium nitride film.

A portion of the upper electrode 207 is extended to the peripheral circuit region and is connected to the wiring layer 402 via a contact formed in a predetermined region of the insulating film 401.

As mentioned above, the formation of the interlayer insulating films, the formation of the contact, and the formation of the wiring layer are repeated as necessary to form the memory cell array and to form the DRAM.

For example, a technique related to the method for manufacturing a stacked capacitor is disclosed in Japanese Laid Open Patent Application (JP-A-Heisei, 11-026712).

In recent years, memory capacity of semiconductor device has been increased. As for DRAM, in particular, a gigabit class memory with the minimum processing dimension of 100 nm will be brought to the commercial stage. A DRAM corresponding to the minimum processing dimension of 90 nm or shorter is under development. In accordance with the miniaturization of elements as mentioned above, the permissible surface area of an electrode of a capacitor as a primary component of DRAM is inevitably reduced, resulting in a difficult situation of securing sufficient electrical capacity of the capacitor.

Under the above situation, a hemispherical silicon silicon plug 202 of polycrystalline silicon is formed in a predetermined position of the second interlayer insulating film 201 composed of silicon oxide. Next, the silicon nitride film 203 is formed on the second interlayer insulating film 201. Next, the third interlayer insulating film 204 of silicon oxide with a thickness of 3000 nm is formed on the silicon nitride film 203. Next, a hard mask 210 with a thickness of 500 nm is formed on the third interlayer insulating film 204. Next, a photoresist 211 is formed on the hard mask 210.

Referring to FIG. 2B, the pattern is formed in the hard mask 210 by lithography and dry etching.

FIG. 2C is a cross sectional view of the capacitor portion 20 in which a deep hole 500 is formed. The third interlayer insulating film 204 and the silicon nitride film 203 are etched by dry etching to form the deep hole 500. The hard mask 210 is used as the etching mask in the dry etching. In this dry etching, a bowing 502 is generated in the region slightly lower than the opening portion of the deep hole 500. The deep hole 500 has the maximum hole width B1 in the bowing 502. The maximum width B1 is larger than a width L1 of the opening in the hard-mask 210. Therefore a portion of the hard mask 210 and a portion of the third interlayer insulating film 204 in the vicinity of the hard mask 210 have an overhang structure 501.

For the dry etching of the third interlayer insulating film 204 as silicon oxide film, gas plasma such as $C_5F_8$, is used. The bonding between Si and O in the silicon oxide is cut by ions generated in the plasma. The resulting free Si reacts with F to form volatile $SiF_4$. Then, $SiF_4$ is removed. Thus, the etching proceeds. An etchant that mainly contributes to the etching is F ion. The F ion is accelerated by a potential difference between the plasma and the substrate generated by a self-bias of the plasma or an intentionally applied bias. The F ions fly into the opening in the hard mask 210 to form the deep hole 500 by etching the third interlayer insulating film 204. Most of F ions are incident on the third interlayer insulating film 204 perpendicularly to the substrate. However, an inclination is generated at the shoulder of the hard mask 210 in the course of the etching. When F ion is incident on the third interlayer insulating film 204 after recoil in the inclination, the F ion is incident on the third interlayer insulating film 204 obliquely to the substrate. Therefore, an increasing number of F ions are incident on the third interlayer insulating film 204 obliquely to the substrate as the etching proceeds. It is considered that the etching of the third interlayer insulating film 204 on the sidewall in the vicinity of the opening portion of the deep hole 500 results in the bowing. The bowing is not a significant problem for a conventional hole relatively shallow. However, the bowing is more significant problem when the hole is narrower for the miniaturization or when the hole is deeper for securing the sufficient electrical capacity.

Referring to FIG. 2D, the lower electrode 205 is formed on the third interlayer insulating film 204 to cover the upper surface of the third interlayer insulating film 204 and inside of the deep hole 500 after the removal of the hard mask 210. The photoresist 210 is filled in the deep hole 500 after the formation of the lower electrode 205.

Referring to FIG. 2E, a portion of the lower electrode 205, which covers the upper surface of the third interlayer insulating film 204, is removed to leave another portion of the lower electrode 205, which covers inside of the deep hole 500. Next, the photoresist 211 is removed.

Referring to FIG. 2F, the dielectric film 206 of the capacitor is formed on the upper surface of the third interlayer insulating film 204 and the another portion of the lower electrode 205. Next, the upper electrode 207 of the capacitor is formed on the dielectric film 206. There is the overhang structure 501 in the opening portion of the deep hole 500. The deep hole 500 has narrower hole width in the opening portion than the maximum hole width B1 in the bowing 502. Therefore, poor (uneven) coverage by the dielectric 206 is caused. The bowing 502 also cause a gap 503 in the middle of the deep hole 500.

As mentioned above, in the conventional method for manufacturing the stacked capacitor provided in the deep hole, the bowing 502 is necessarily generated when the deep hole 500 deeper than the conventional hole is formed by the anisotropic dry etching. When the bowing 502 is generated, the overhang structure 501 appears in the opening portion of the deep hole 500 and the hole width L1 in the opening portion is narrower than the hole width B1 in the bowing 502. As a result, in the succeeding processes, even if the upper electrode 207 is formed till the upper electrode 207 closes the opening portion of the deep hole 500, the gap 503 is generated in the deep hole 500. Consequently, the capacitor is extremely weak to mechanical stress. To be more specific, the capacitor is susceptible to the influence of a stress caused by the insulating film 401 in the process of forming the wiring layer 402 and a stress caused by a mold resin in a packaging process. Therefore, even if the characteristics of the capacitors satisfy the predetermined standard in a test performed immediately after the formation of the capacitors, there is a problem that a product yield is poor in a test performed after the packaging process and before shipping.

Moreover, in the process of forming the dielectric 206 of the capacitor, the overhang structure 501 where the opening portion of the deep hole 500 is narrow causes the poor coverage by the dielectric 206, resulting in a poor reliability of the capacitor.

SUMMARY OF THE INVENTION

The first objective of the present invention is to prevent the formation of a gap in a capacitor provided in a hole.

The second objective of the present invention is to provide a highly reliable capacitor with improved coverage by the dielectric film of the capacitor.

In an aspect of the present invention, a method for manufacturing a capacitor includes depositing an interlayer insulating film on or above a plug connected to a switching element, forming a hole in the interlayer insulating film such that the opening portion of the hole is surrounded by an overhang structure and that the plug is exposed in the bottom of the hole, removing the overhang structure, forming a lower electrode on the inner surface of the hole, forming a dielectric on the lower electrode, and forming an upper electrode on the dielectric.

The above steps prevent the formation of a gap in the capacitor, since the overhang structure, which causes the gap, is removed. The coverage by the dielectric is also prevented from being poor.

When the hole is formed to have a bowing shape in which the hole has the maximum hole width, the overhang structure is preferably removed such that a hole width of the hole in the opening portion after the removal is wider than the maximum hole width.

The step of depositing the interlayer insulating film, preferably includes depositing a first interlayer insulating film on or above the plug, followed by deposition of a second interlayer insulating film on the first interlayer insulating film. In this case, an etching rate of the second interlayer insulating film is higher than that of the first interlayer insulating film upon wet etching with a predetermined condition. The overhang structure is etched by wet etching method with the predetermined condition in the removing step.

The different etching rates of the first and second interlayer insulating films enables the removal of the overhang structure while preventing short circuit between the capacitor and another capacitor adjacent to it.

The step of removing the overhang structure preferably includes forming a member in the hole to protect a first portion of a sidewall and not to protect a second portion of the sidewall, followed by removal of the second portion. The hole is surrounded by the sidewall. The opening portion is surrounded by the second portion.

The member is preferably formed to cover the first portion and not to cover the overhang structure. The widest portion of the hole is surrounded by the first portion.

It is preferable that the member is an organic photoresist film.

The step of forming the hole preferably includes forming a hard mask on the interlayer insulating film, removing a portion of the hard mask and forming the hole to have a bowing shape, arranged in the hard mask, in which the hole has the maximum hole width. After that, the overhang structure is removed by removing the hard mask.

In this case, the overhang structure can be removed without etching of the interlayer insulating film.

The step of depositing the interlayer insulating film preferably includes depositing a first interlayer insulating film of a first material on or above the plug, followed by deposition of a second interlayer insulating film of a second material on the first interlayer insulating film. In this case, an etching rate of the second material is higher than that of the first material upon wet etching with a predetermined condition. Moreover, the overhang structure is etched by wet etching method with the condition in the removing step.

In another aspect of the present invention, a memory cell includes a switching element, a plug, a stacked interlayer insulating film and a capacitor. The plug is formed in an interlayer insulating film formed on the switching element. The stacked interlayer insulating film is deposited on or above the interlayer insulating film. The capacitor is provided in a hole formed in the stacked interlayer insulating film. The plug connects electrically between the switching element and the capacitor.

The stacked interlayer insulating film preferably includes a first interlayer insulating film and a second interlayer insulating film. The first interlayer insulating film is deposited on or above the interlayer insulating film. The second interlayer insulating film is deposited on the first interlayer insulating film. An etching rate of the second interlayer insulating film is higher than that of the first interlayer insulating film upon wet etching with a predetermined condition. An opening portion of the hole is provided in the second interlayer insulating film.

Instead, the stacked interlayer insulating film preferably includes a first interlayer insulating film of a first material and a second interlayer insulating film of a second material. The first interlayer insulating film is deposited on or above the interlayer insulating film. The second interlayer insulating is deposited on the first interlayer insulating film.

In this case, it is more preferable that an etching rate of the second material is higher than that of the first material upon wet etching with a predetermined condition.

In still another aspect of the present invention, a dynamic random access memory (DRAM) includes a memory cell array and an address decoder. The memory cell array includes a plurality of memory cells arranged in a matrix array. The address decoder is configured to selectively activate one of the plurality of memory cells based on address data. The memory cell array includes one of the memory cells above mentioned.

The present invention can improve the quality of a miniaturized stacked-capacitor provided in a deep hole by preventing the formation of gap in the capacitor. The present invention can provide a highly reliable capacitor with improved coverage by the dielectric film of the capacitor.

DESCRIPTION OF THE PREFERRED EMBODIMENTS

Figure 1:
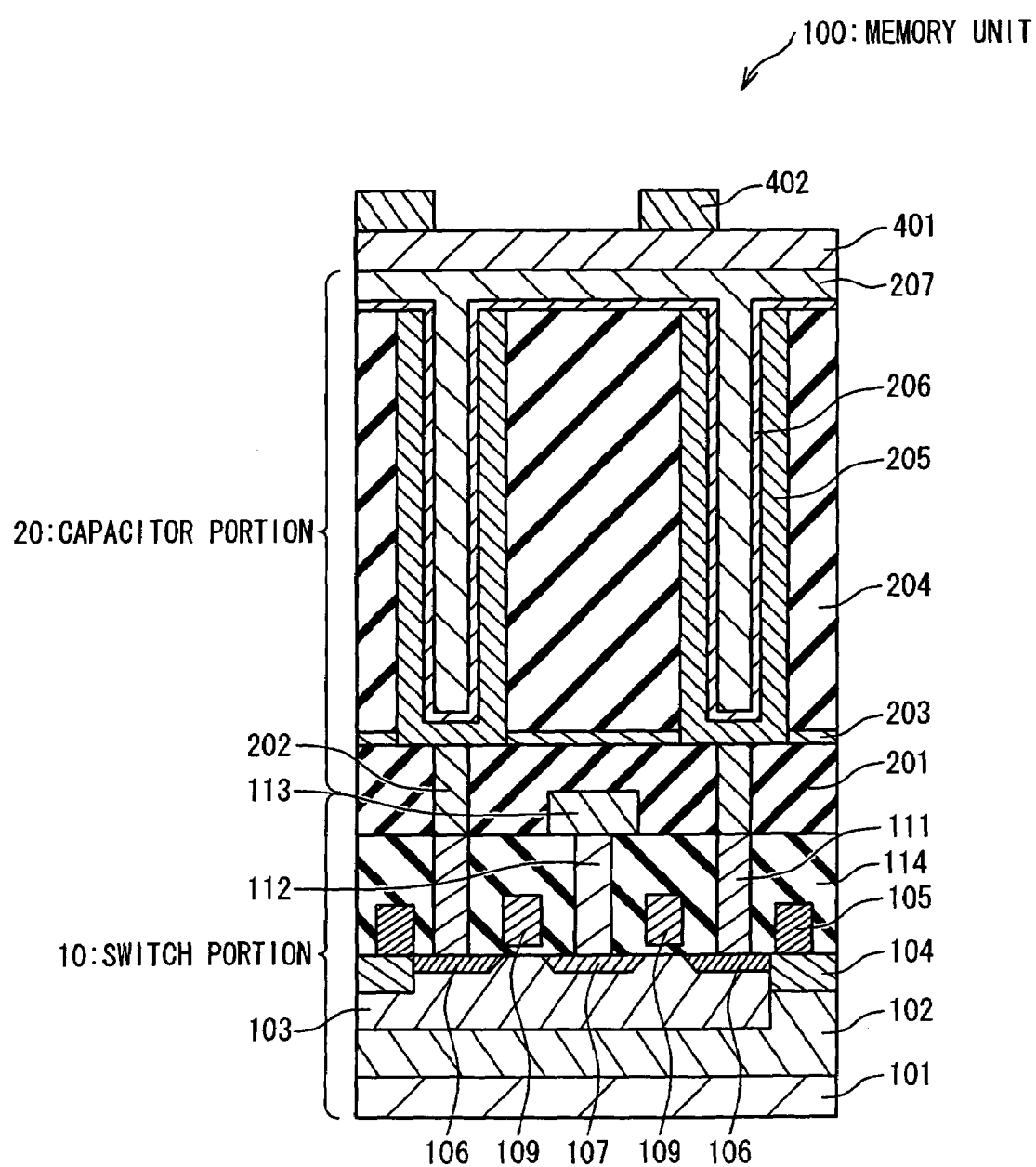
FIG. 1 is a cross sectional view showing the configuration of a memory unit of a DRAM according to a conventional technique.
Figure 2A:
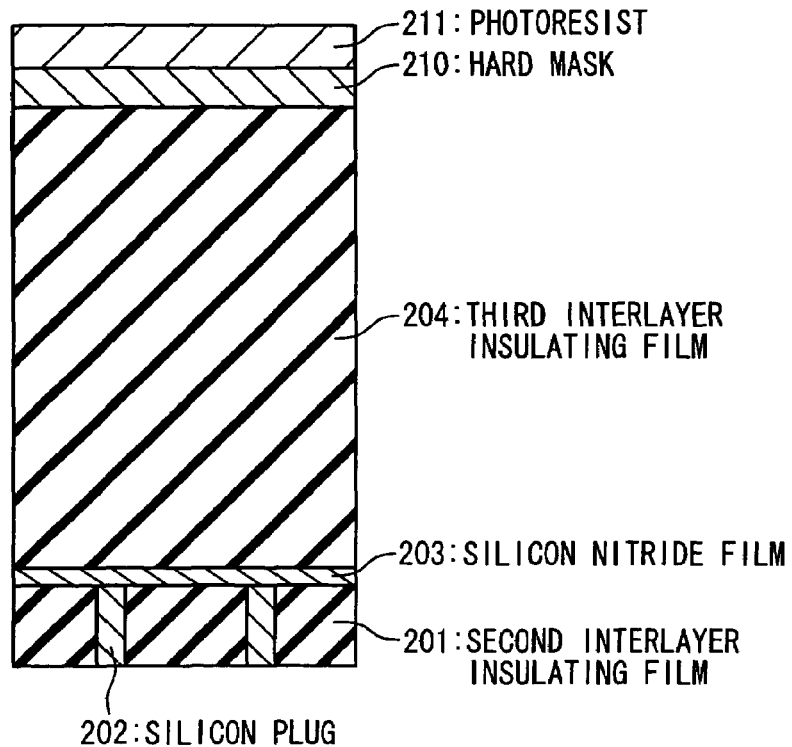
FIGS. 2A to 2F are cross sectional views of a capacitor portion showing a flow of a method of manufacturing the capacitor according to the conventional technique.
Figure 2B:
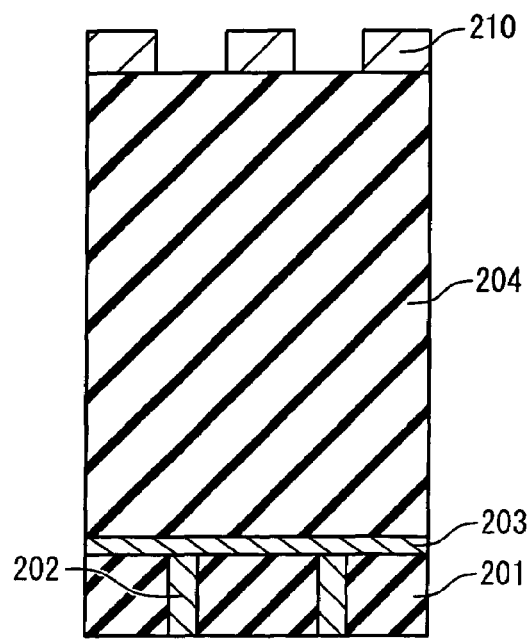
Figure 2C:
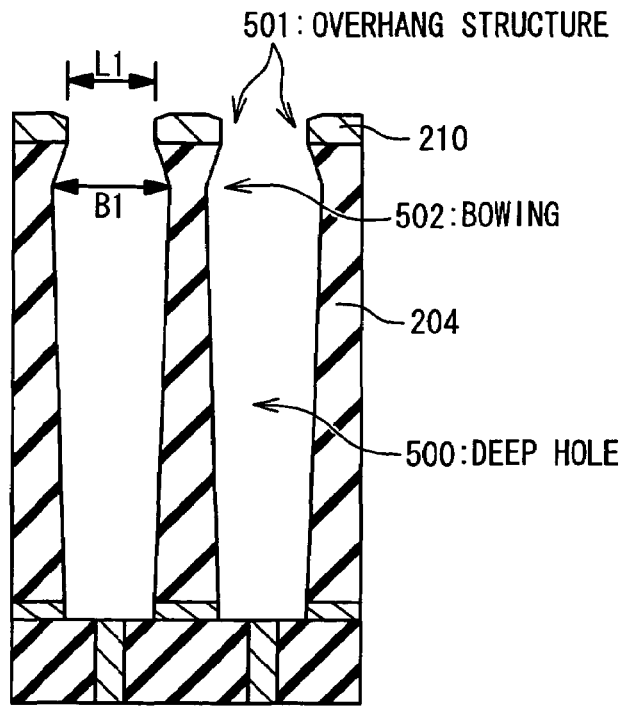
Figure 2D:
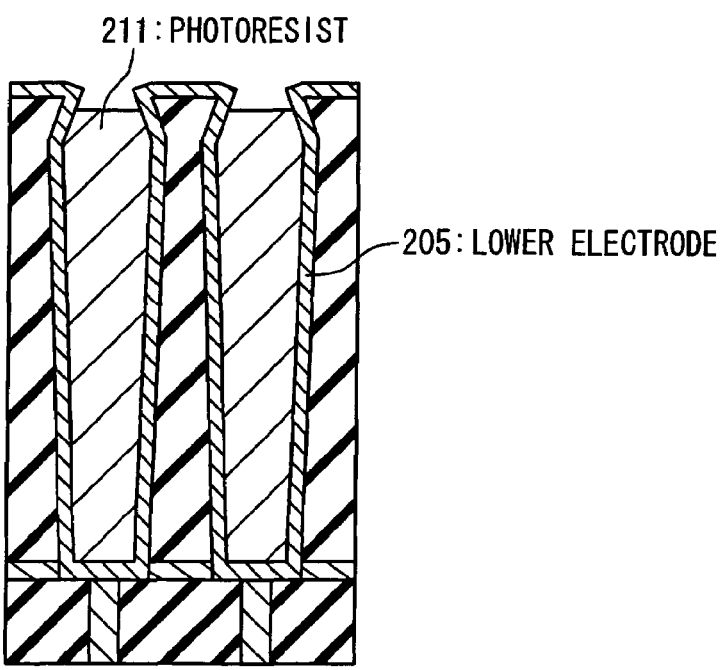
Figure 2E:
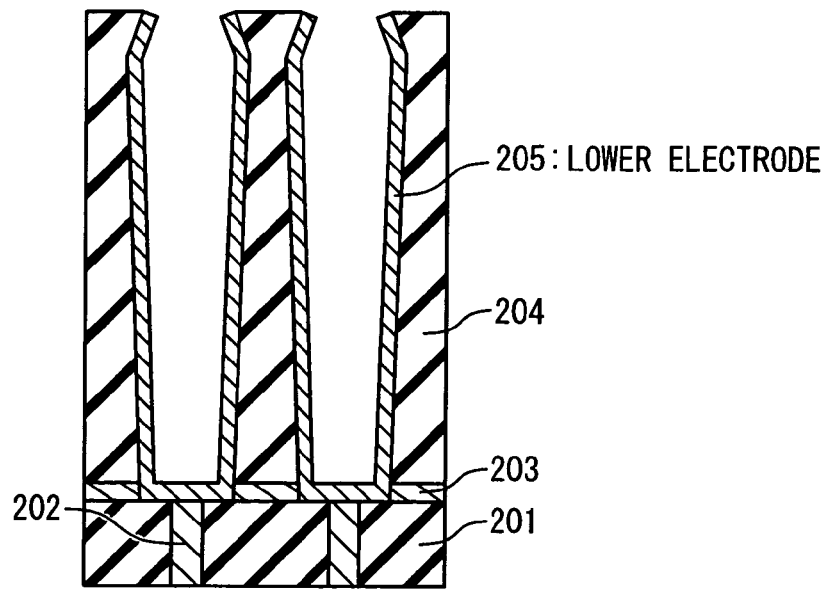
Figure 2F:
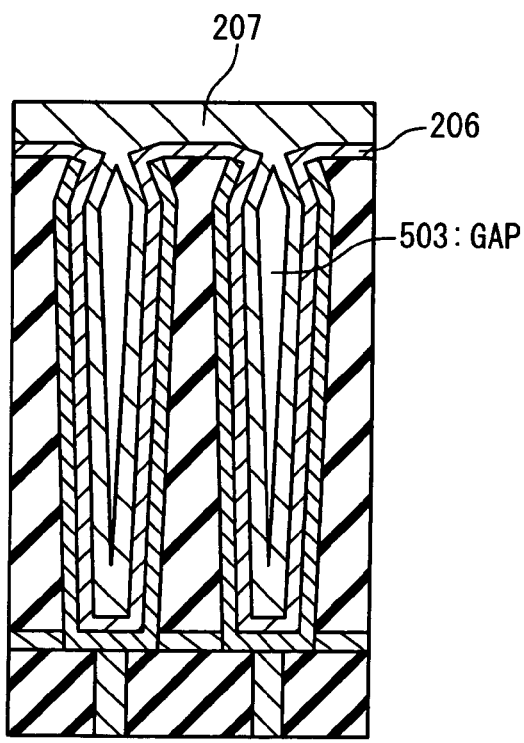

Embodiments of the present invention will be described below with reference to the accompanying drawings. In the drawings, the same or similar reference numerals denote the same, similar or equivalent elements.

(Configuration of DRAM)

Figure 3:
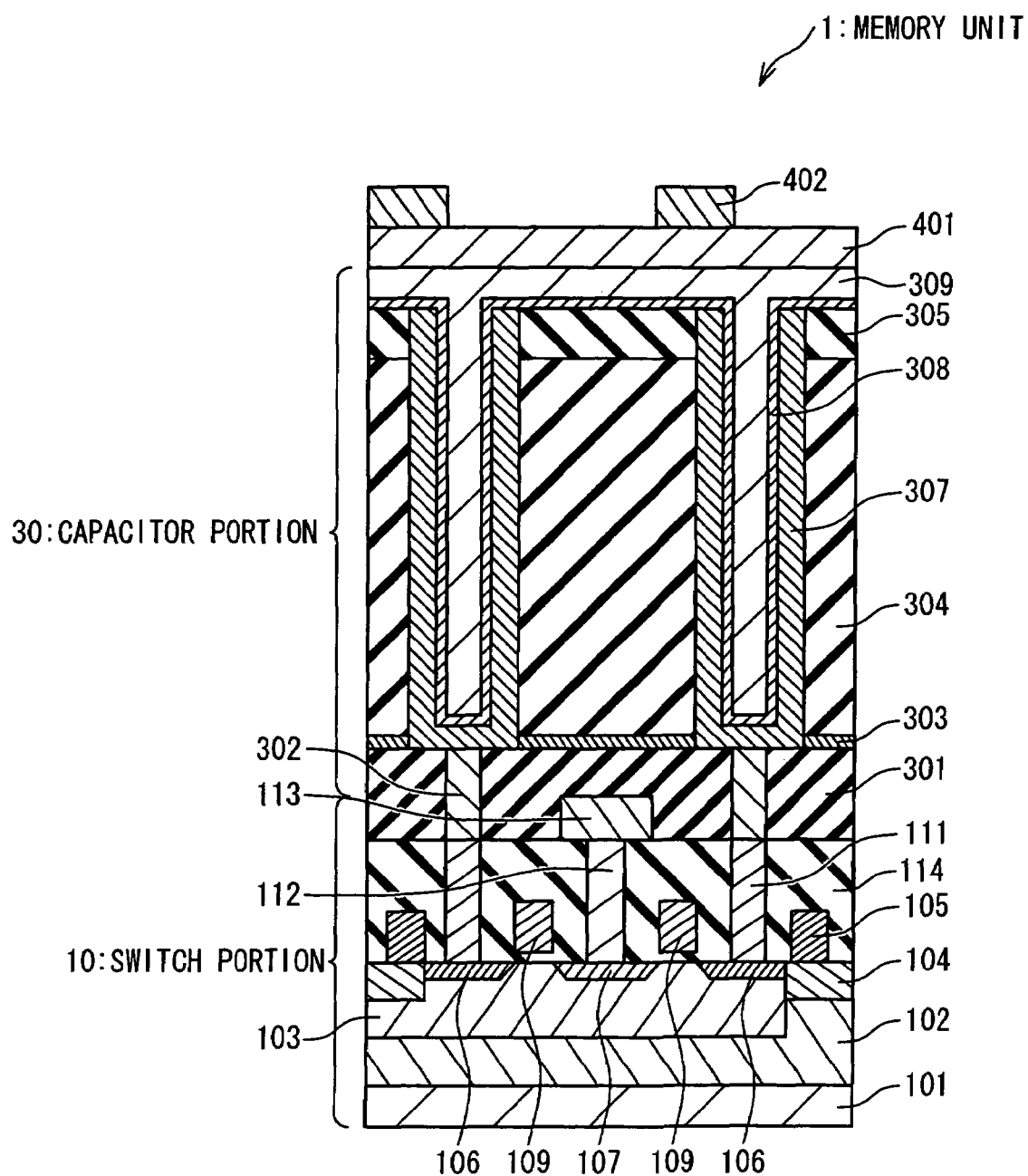
FIG. 3 is a cross sectional view showing the configuration of a memory unit of a DRAM according to the present invention.

Referring to FIG. 3 the configuration of a dynamic random access memory (DRAM) according to the embodiments of the present invention will be explained. FIG. 3 is a cross sectional view showing the configuration of a memory unit 1 of the DRAM according to the present invention. The DRAM according to the present invention includes the memory unit 1 provided with a capacitor portion 30 having two stacked capacitors, and with the switch portion 10. Each of the stacked capacitors is provided in each of two deep holes. The memory unit 1 is arranged in a matrix array to form a memory cell array. A peripheral circuit region (not shown) is provided in adjacent to the memory unit 1. The DRAM includes an address decoder (not shown) configured to selectively activate one of memory cells of the memory cell array based on address data. The memory unit 1 according to the present invention is provided on a p-type substrate 101. The memory unit 1 includes the switch portion 10 connected to the bit line 113 and the word lines 109, and the capacitor portion 30 connected to the wiring layer 402. Since the configurations of the switch portion 10 and the wiring layer 402 are the same as those of the switch portion 10 and the wiring layer 402 in the conventional technique explained above, explanation of the configurations of the switch portion 10 and the wiring layer 402 will be omitted.

On the bit line 113, a second interlayer insulating film 301 is provided. For each drain 106 of the switching transistors (switching elements) in the switch portion 10, a contact 111 is provided in a predetermined region of first interlayer insulating film 114. Each contact 111 is connected to each drain 106. For each contact 111, a silicon plug 302 is provided in the second interlayer insulating film 301. Each silicon plug 302 is connected to each contact 111. Each silicon plug 302 is connected to each of the capacitors in the capacitor portion 30.

A silicon nitride film 303 is provided on the second interlayer insulating film 301. A third interlayer insulating film 304 is provided on the silicon nitride film 303. A fourth interlayer insulating film 305 is provided on the third interlayer insulating film 304. For each silicon plug 302, each of the deep holes is provided in a predetermined region of the silicon nitride film 303, third interlayer insulating film 304 and forth interlayer insulating film 305. For each deep hole, a lower electrode 307 is provided on the inner surface of the deep hole. Each lower electrode 307 is connected to each silicon plug 302. A dielectric 308 is provided on the forth interlayer insulating film 305 and each lower electrode 307. An upper electrode 309 is provided on the dielectric 308. Each of the capacitors, which include the lower electrode 307, dielectric 308 and upper electrode 309, is arranged in the deep hole. The capacitors are stacked capacitors. An insulating film 401 is provided on the upper electrode 309. On the insulating film 401, provided is the wiring layer 402 composed of a titanium nitride film, an aluminum film and a titanium nitride film.

A portion of the upper electrode 309 provided in the memory unit 1, is extended to the peripheral circuit region and is connected to the wiring layer 402 via a contact formed in a predetermined region of the insulating film 401.

The memory unit 1 of above configuration is repeated to form the memory cell array and thus to configure the DRAM.

First Embodiment

Referring to FIGS. 4A to 4H, a method for manufacturing the memory unit 1 according to a first embodiment of the present invention will be explained.

In a method for manufacturing the capacitor according to the first embodiment, the third interlayer insulating film 304 is initially deposited by chemical vapor deposition (CVD) method on or above the second interlayer insulating film 301 in which the silicon plug 302 is formed. The silicon plug 302 is connected to the impurity diffusion layer in the surface of the semiconductor substrate. The capacitor is formed in the third interlayer insulating film 304 in the following steps. Next, the fourth interlayer insulating film 305 is deposited on the third interlayer insulating film 304. The third interlayer insulating film 304 and forth interlayer insulating film 305 form a stacked interlayer insulating film 306 in which the forth interlayer insulating film 305 is stacked on the third interlayer insulating film 304. The forth interlayer insulating film 305 has higher wet etching rate than that of the third interlayer insulating film 304. At this time, the third interlayer insulating film 304 is deposited to be thicker than the fourth interlayer insulating film 305. Next, a hard mask 310, which is used as a mask for a dry etching of the third interlayer insulating film 304 and forth interlayer insulating film 305 in the following steps, is deposited on the fourth interlayer insulating film 305. An opening is formed in the predetermined region of the hard mask 310 by lithography and dry etching such that the upper surface of the forth interlayer insulating film 305 is exposed in the opening. At this time, a portion of the hard mask 310 is removed to form the opening. Next, the stacked interlayer insulating film 306 is subjected to the dry etching with the hard mask 310 as the etching mask to form the deep hole in the stacked interlayer insulating film 306. The deep hole is formed to penetrate the stacked interlayer insulating film 306 and silicon nitride film 303 in the thickness direction of the films. At this time, the deep hole is formed to have the bowing 602 in the predetermined position in the 304. Next, wet etching is conducted to the third interlayer insulating film 304 and forth interlayer insulating film 305 to expand the inner diameter, or the bore, of the deep hole 600. Next, the material for the lower electrode 308 is deposited by CVD method on the entire surface including the internal surface of the deep hole 600. Following next is the removal of a portion of the dielectric 308 on the upper surface of the forth interlayer insulating film 305. At this time, the portion of the dielectric 308 is removed by anisotropic dry etching or a chemical mechanical polishing (CMP) with a resist in the deep hole 600 for the protection of the inside of the deep hole 600. The upper surface of the forth interlayer insulating film 305 faces upward to the wiring layer 402. Next, the dielectric 308 and the upper electrode 309 of the capacitor are formed on the entire of exposed surfaces of the lower electrode 307 and forth interlayer insulating film 305 to prepare the capacitor.

FIGS. 4A to 4H are cross sectional views of the capacitor portion 30 showing a series of flow for the manufacturing process of the capacitor portion 30 according to the present invention. Referring to FIGS. 4A to 4H, a method for manufacturing the capacitor according to the first embodiment will be explained below.

Figure 4A:
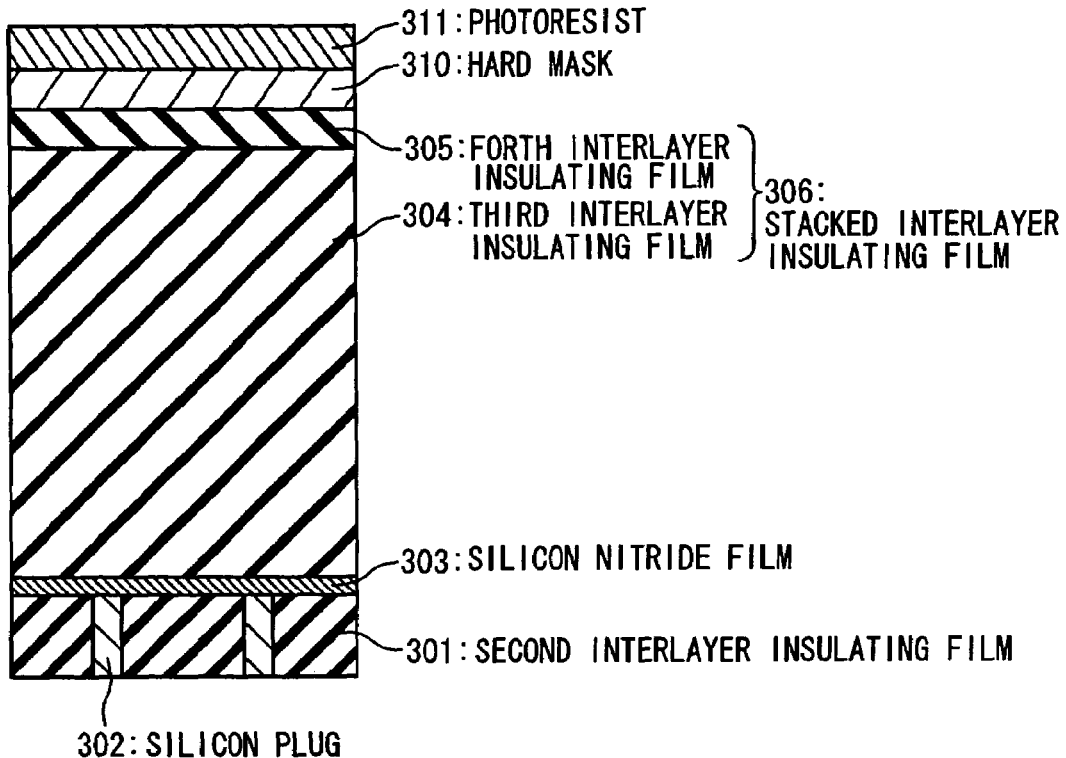
FIGS. 4A to 4H are cross sectional views of a capacitor portion showing a flow of a method of manufacturing a capacitor according to a first embodiment of the present invention.

FIG. 4A shows the capacitor portion 30 in a state before the formation of the opening in the hard mask 310. Referring to FIG. 4A, the silicon plug 302 of polysilicon is formed in the predetermined region of the second interlayer insulating film 301 of silicon oxide. At this time, silicon oxide is deposited to form a polysilicon film containing phosphorus by CVD method using material gas of monosilane ($SiH_4$) and phosphine ($PH_3$). The polysilicon film is formed such that a portion of the film is filled in the hole in the predetermined region of the second interlayer insulating film 301. Then, the film except the portion in the hole is removed by dry etching to form the silicon plug 302. The silicon plug 302 may be prepared by forming a silicon film in amorphous state followed by thermal treatment to change the state of the silicon film from amorphous to polycrystalline, in place of forming the polysilicon film. Disilane ($Si_2H_6$) gas may be used as material gas in place of monosilane gas.

After the formation of the silicon plug 302, the silicon nitride film 303 of about 50 nm thickness is formed on the second interlayer insulating film 301 by CVD method using material gas of dichlorosilane ($SiH_2Cl_2$) and ammonia ($NH_3$). The silicon plug 302 may be formed after the formation of the silicon nitride film 303. In that case, a hole is formed in the second interlayer insulating film 301 and the silicon nitride film 303 followed by the formation of the silicon plug 302 in the hole. Following next is formation of the third interlayer insulating film 304 of silicon oxide with a thickness of 2700 nm by plasma CVD method using material gas of tetraethoxysilane ($Si(OC_2H_5)_5$) and oxygen. Thereafter, the fourth interlayer insulating film 305 with a higher wet etching rate than that of the third interlayer insulating film 304 is formed on the third interlayer insulating film 304. A silicon oxide film (boro-phospho silicate glass (BPSG) film) with a thickness of 300 nm is deposited as the fourth interlayer insulating film 305 by reduced pressure CVD method using material gas containing, for example, tetraethoxysilane ($Si(OC_2H_5)_5$), triethoxyboron (TEB) and triethyl phosphate (TEOP). At this time, thermal treatment at about 700° C. may be applied after depositing the BPSG film. A phospho silicate glass (PSG) film or coated silicon oxide film such as spin on glass (SOG) film may also be used as the fourth interlayer insulating film 305 in place of the BPSG film. As mentioned above, the interlayer insulating film 306 of the stacked structure where the forth interlayer insulating film 305 is stacked on the third interlayer insulating film 304 is formed. After the formation of the fourth interlayer insulating film 305, a silicon film of 500 nm thickness is formed by CVD method as the hard mask 310. For the hard mask 310, amorphous carbon film may be used in place of the silicon film. After the formation of the hard mask 310, the photoresist 311 is formed by spin-coating method.

Figure 4B:
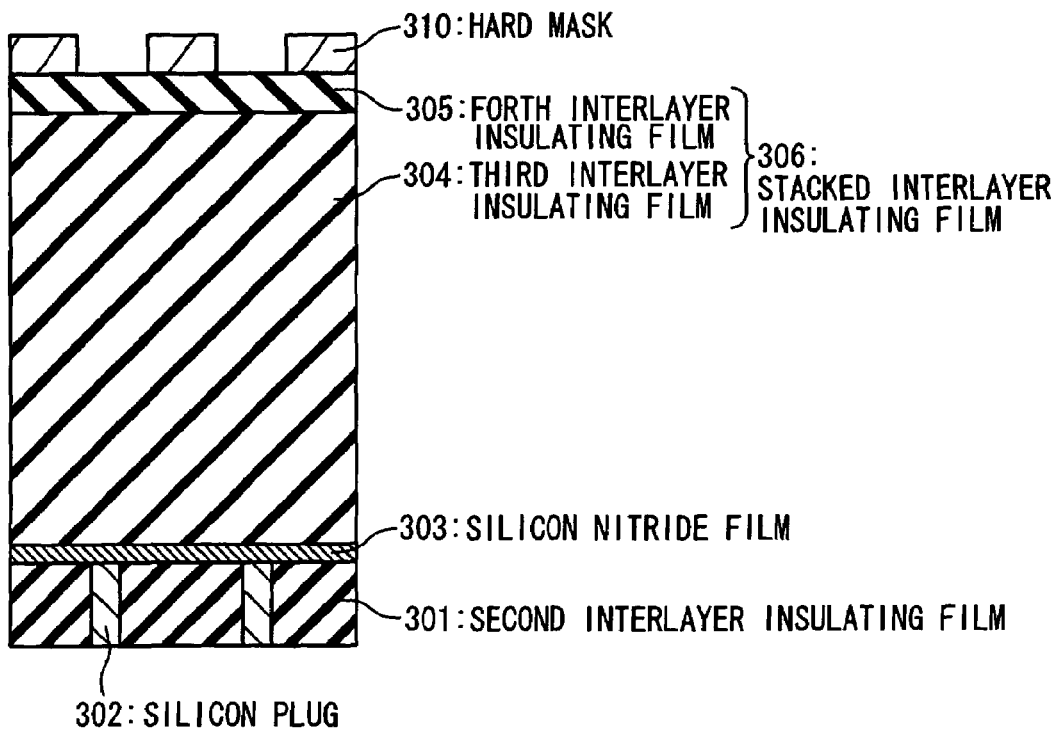

Referring to FIG. 4B, the silicon film is processed by lithography method and dry etching method to form a predetermined pattern in the hard mask 310. For the dry etching of the silicon film, for example, an etching condition with a mixed gas of $Cl_2$, HBr (hydrogen bromide) and $O_2$ as an etching gas, etching pressure of 10 mTorr and plasma power of 100 W can be applied. A chlorine-based gas such as the mixed gas is basically used as the etching gas.

Figure 4C:
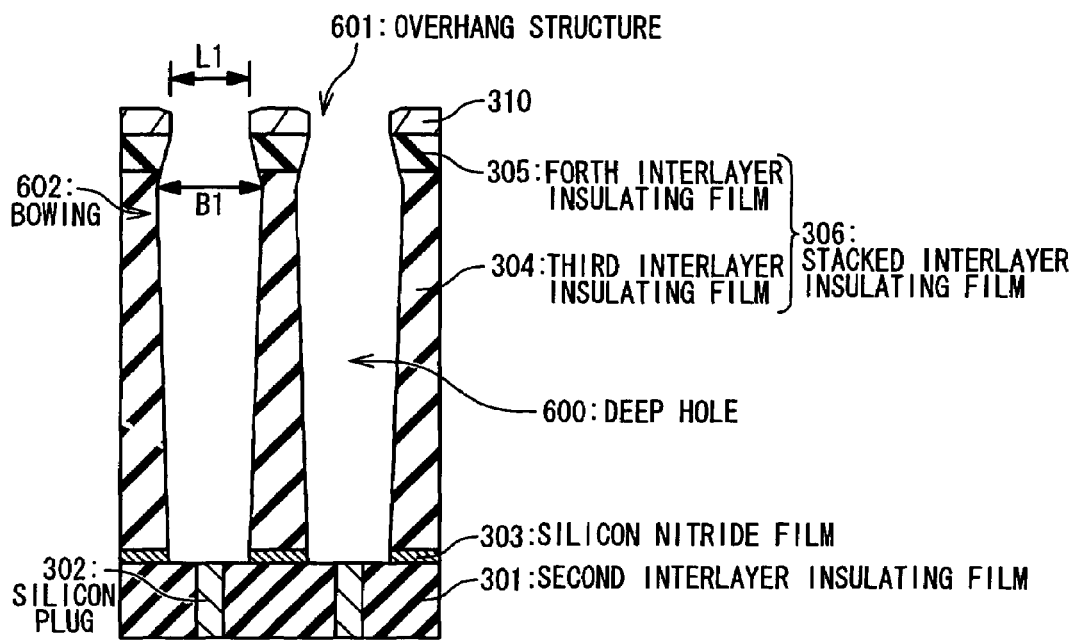

Referring to FIG. 4C, the interlayer insulating film 306 composed of stacked layers of the third interlayer insulating film 304 and forth interlayer insulating film 305 is subjected to anisotropic dry etching to form the deep hole 600. For the dry etching of the stacked interlayer insulating film 306 containing silicon oxide, for example, an etching condition with a mixed gas of $C_5F_8$, Ar and $O_2$ as an etching gas, etching pressure of 100 mTorr and plasma power of 1500 W can be applied. It is preferable that a fluorine-based gas (F-based gas) is basically used as the etching gas, and that a condition with high plasma power is selected to enhance the etching action of etching ions. It is preferable that a bowing 602 is formed in the third interlayer insulating film 304 at the position slightly lower than the upper surface of the third interlayer insulating film 304 in the course of the etching. The maximum bore size (maximum hole width or inner diameter) B1 of the bowing 602 is larger than the bore size (hole width or inner diameter) L1 of the opening portion of the deep hole 600.

Figure 4D:
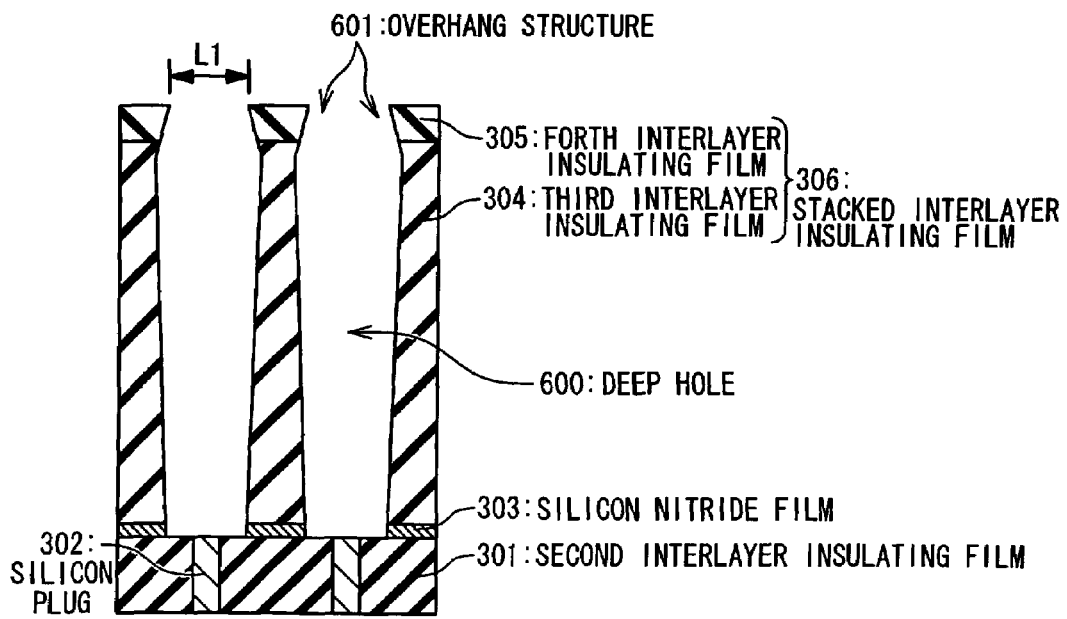

FIG. 4D is a cross sectional view showing the capacitor portion 30 after the removal of the hard mask 310. Referring to FIG. 4D, when the silicon film is used as the hard mask 310, the photoresist is filled in the deep hole 600 to protect the inside of the deep hole 600. After that, dry etch-back is applied to the entire surface to remove the remaining hard mask 310, resulting in complete removal of the silicon film remaining on the upper surface of the stacked interlayer insulating film 306. For the dry etch-back, for example, an etching condition with a mixed gas of $Cl_2$, HBr and $O_2$ as an etching gas, etching pressure of 0.6 Pa and plasma power of 600 W can be applied. Meanwhile, when the amorphous carbon film is used as the hard mask 310, the hard mask 310 can be easily removed by gas plasma of oxygen alone.

Figure 4E:
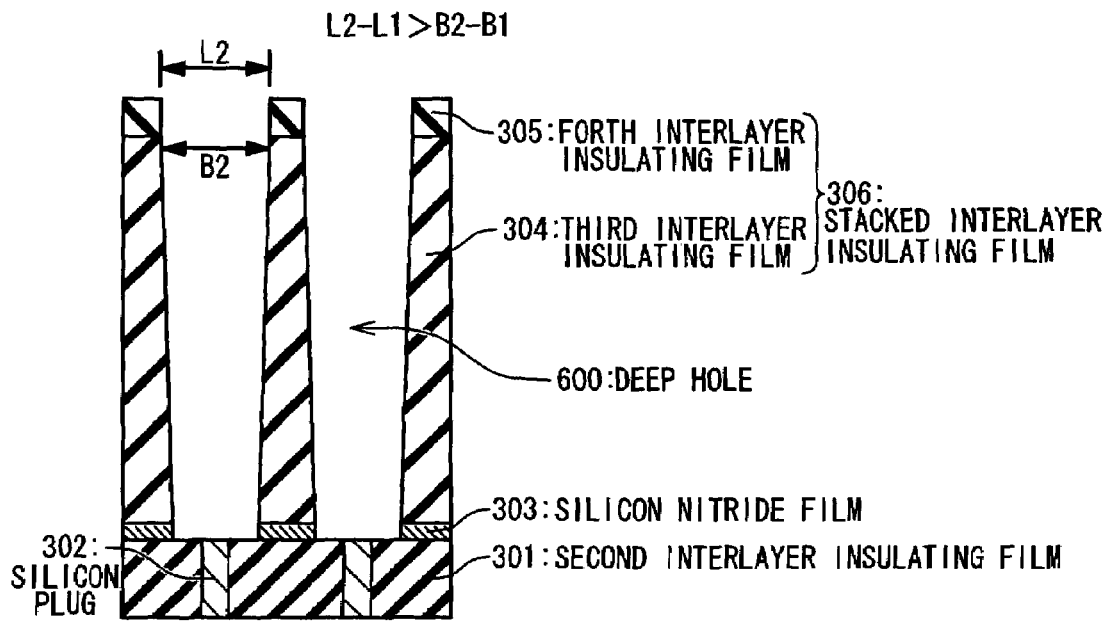

Referring to FIG. 4E, after the removal of the hard mask 310, the deep hole 600 is widened by wet etching. For the wet etching, hydrogen fluoride (HF) is used. Hydrogen fluoride containing ammonium fluoride or ammonia hydrogen peroxide mixture may be used in place of hydrogen fluoride. In other words, hydrofluoric acid is used as etching liquid in the wet etching. Hydrofluoric acid containing ammonium fluoride or ammonia hydrogen peroxide mixture may be used in place of hydrofluoric acid in the wet etching. The stacked insulating film 306 is composed of the third interlayer insulating film 304 and the fourth interlayer insulating film 305. The rate of wet etching of the forth interlayer insulating film 305 is higher than that of the third interlayer insulating film 304. In other words, the etching rate of the material of the forth interlayer insulating film 305 is higher than that of the material of the third interlayer insulating film 304 upon the wet etching with the condition above mentioned. Therefore, the change in the size L1 of the bore in the opening portion of the deep hole 600 is larger than the change in the maximum bore size (maximum hole width) B1 of the bowing 602 in the wet etching. Namely, the following equation is true:

$$L2-L1 > B2-B1$$

where L1 is the size of the bore (hole width) in the opening portion of the deep hole 600 before the widening, L2 is the size of the bore (hole width) in the opening portion of the deep hole 600 after the widening, B1 is the maximum bore size (maximum hole width) of the bowing 602 before the widening and B2 is the maximum bore size (maximum hole width) of the bowing 602 after the widening. Therefore, the size L1 of the bore (hole width) can be widened while preventing interconnection between the deep hole 600 and another deep hole adjacent to the deep hole 600 in the portion where the deep hole 600 has the maximum bore size (maximum hole width) B1. The interconnection between the deep holes results in short circuit between capacitors in the deep holes. Moreover, the size L1 of the bore (hole width) in the opening portion of the deep hole 600 can be widened to the extent that the size L2 of the bore is equal or wider than the maximum bore size (maximum hole width) B2 of the bowing 602. That is, the overhang structure 601, which is formed in the formation process of the deep hole 600, can be eliminated. The opening portion of the deep hole is surrounded by the overhang structure.

Figure 4F:
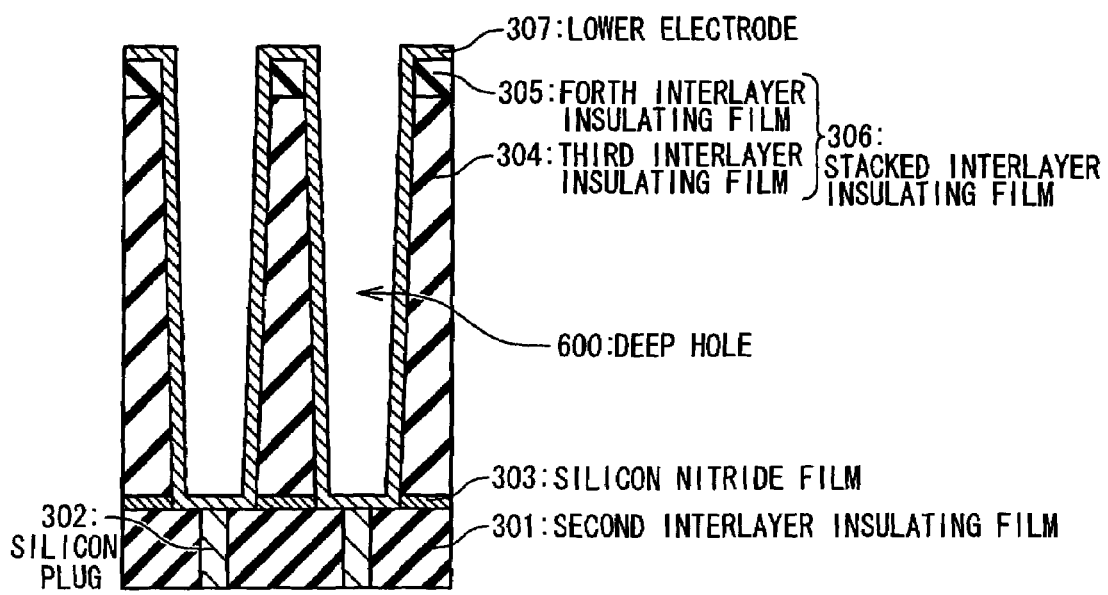

Referring to FIG. 4F, after the removal of the overhang structure 601, the exposed surface including the internal surface of the deep hole 600 is coated with the lower electrode 307. A silicon film containing phosphorus with a thickness of about 30 to 50 nm is formed as the lower electrode 307 by CVD method after conduction of resistance lowering process to the surface of the silicon plug 302. At this time, the silicon film is polycrystallized by thermal treatment at 700° C. to have electric conductivity. The thermal treatment for polycristallization can be substituted by subsequent processes with heating. Alternatively, the silicon film containing phosphorus with a thickness of about 30 to 50 nm is deposited in the amorphous state by CVD method. A hemispherical silicon grain (HSG) layer is formed by the growth of silicon grains on the surface of the lower electrode 307. The growth of silicon grains is conducted by irradiation of silane (SiH4) and thermal treatment. When the HSG layer is formed, for example, phosphorus (P) is doped into the lower electrode 307 in vapor phase containing phosphine ($PH_3$) in order to supplement phosphorus in the surface of the lower electrode 307.

Figure 4G:
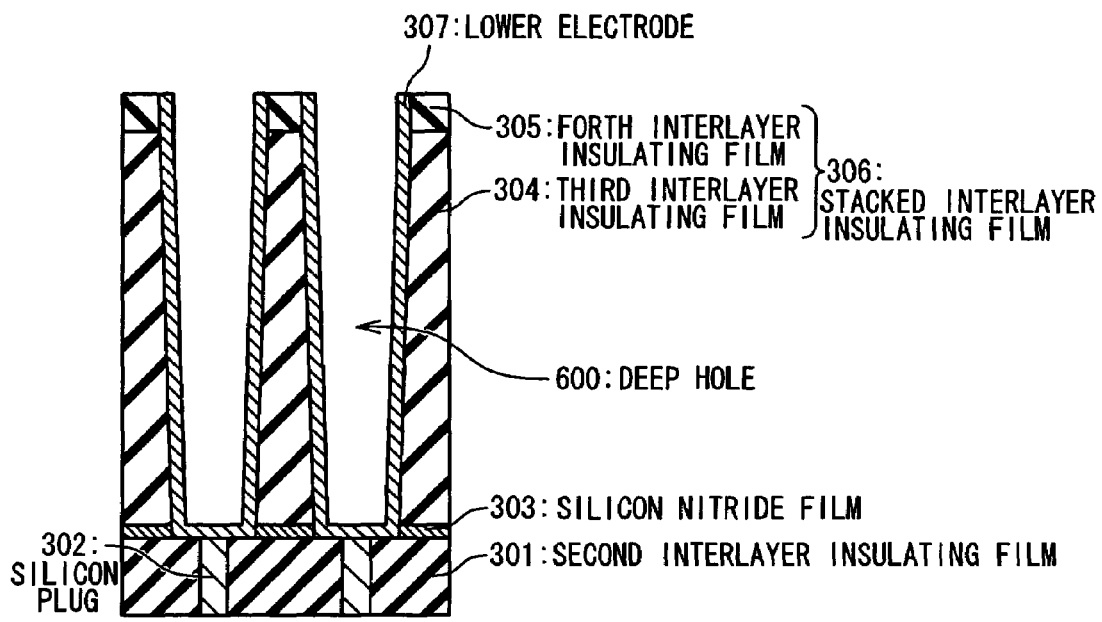

Referring to FIG. 4G, the lower electrode 307 except a portion in the deep hole 600 is removed. In other words, a portion of the lower electrode 307 formed on the upper surface of the forth interlayer insulating film 305 is removed to leave the portion of the lower electrode 307 formed in the deep hole 600. The lower electrode 307 on the upper surface of the forth interlayer insulating film 305 is removed in the following processes. First, the deep hole 600 is filled with photoresist to protect the inside of the deep hole 600. At this time, the photoresist is formed by the spin-coating method to completely protect the inside of the deep hole 600. Following next is exposure and development processes to arrange the upper surface of the photoresist lower than the upper surface of the fourth interlayer insulating film 305. Thereafter, the entire surface is brought into dry etch-back to remove the portion of the lower electrode 307 from the upper surface of the forth interlayer insulating film 305. The dry etch-back is performed by dry etching method. Referring to the condition of the dry etching, for example, a mixed gas of $Cl_2$, HBr and $O_2$ can be used as etching gas. After removing the portion of the lower electrode 307 on the upper surface of the forth interlayer insulating film 305 by the dry etch-back on the entire surface, the remaining photoresist in the deep hole 600 is removed by oxygen ($O_2$) ashing.

Figure 4H:
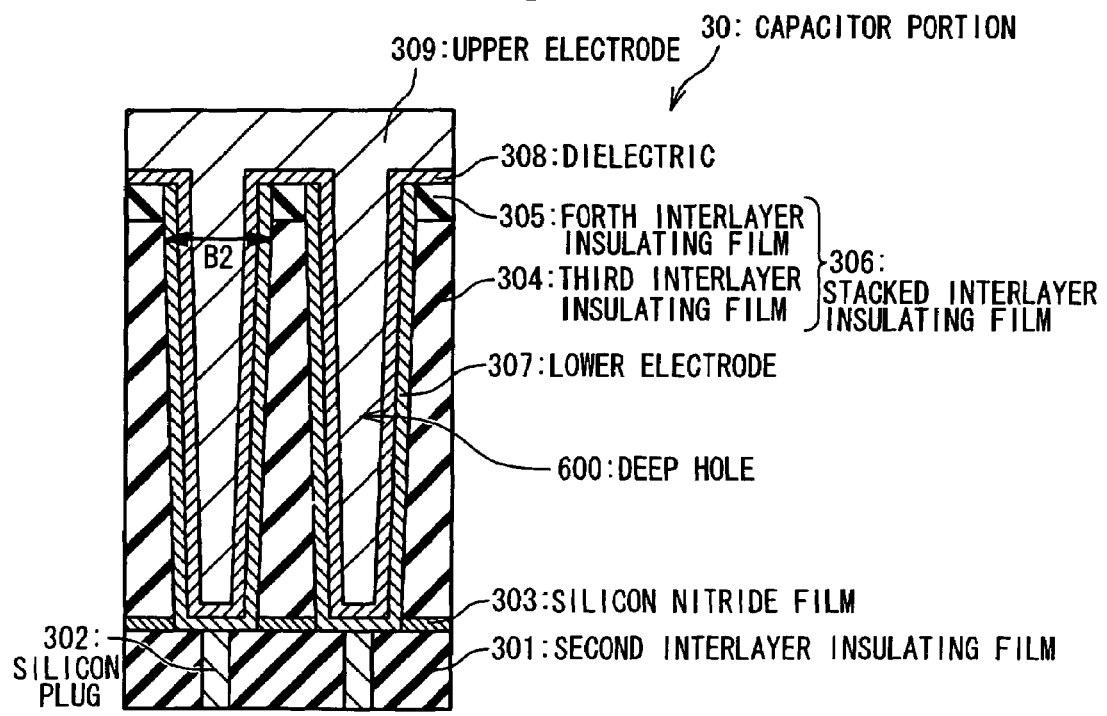

Referring to FIG. 4H, the dielectric 308 and the upper electrode 309 as components of the capacitor are formed. There is native oxide in the surface of the lower electrode 307 that contains silicon. After removal of the native oxide by washing, the capacitor portion 30 is subjected to thermal treatment in ammonia ($NH_3$) atmosphere at 750° C. to form silicon nitride of 1 nm thickness in the surface of the lower electrode 307. Following next is formation of tantalum oxide of 8 nm thickness by CVD method using material gas of pentaethoxytantalum ($Ta(OC_2H_5)_5$) and oxygen. Thereafter, the tantalum oxide is supplemented with oxygen and is crystallized to form the dielectric 308 by thermal treatment in nitrous oxide ($N_2O$) atmosphere at 750° C. At this time, the silicon nitride is oxidized to be silicon oxynitride by the thermal treatment in the oxidizing atmosphere. Next, the upper electrode 309 is formed to cover the dielectric 308 by CVD method using material gas of titanium chloride (TiCl$_4$) and NH$_3$. The upper electrode contains titanium nitride.

In the first embodiment, the interlayer insulating film 306 is formed to have the third interlayer insulating film 304 and the forth interlayer insulating film 305 stacked on the third interlayer insulating film 304. The etching rate of the forth interlayer insulating film 305 is higher than that of third interlayer insulating film 304 in the wet etching. Therefore, when the wet etching is conducted to widen the deep hole 600, the change (L2−L1) in the size L1 of the bore in the opening portion of the deep hole 600 is larger than the change (B2−B1) in the maximum bore size (maximum hole width) B1 of the bowing 602. Thus, the size L1 of the bore (hole width) in the opening portion of the deep hole 600 can be widened to the extent that the size L2 of the bore is equal or wider than the maximum bore size B2 (maximum hole width) of the bowing 602. The overhang structure 601 in the opening portion of the deep hole 600 is improved by the wet etching. Accordingly, the coverage by the dielectric film, which is poor in the conventional technique, is prevented from being poor. Also, in the process of forming the upper electrode, the gap in the middle of the deep hole, which is generated in the conventional technique, is prevented from being generated. Consequently, the capacitor with high reliability can be obtained in the first embodiment of the present invention.

By the way, the silicon film is used as the lower electrode 307 in the present embodiment. A metal film, such as tungsten film, tungsten nitride film or ruthenium film, can be used as the lower electrode 307 in place of the silicon film. The electrical capacity of the capacitor with the metal film as the lower electrode 307 is larger than that of the capacitor with the silicon film as the lower electrode 307. When the metal film is used as the lower electrode 307, it is preferable that an additional layer is provided on the surface of the silicon plug 302 to prevent silicide formation on the silicon plug 302 before the formation of the lower electrode 307.

The dielectric 308 is prepared by the formation of the tantalum oxide by CVD method followed by the thermal treatment to oxidize the tantalum oxide. Atomic layer deposition method can be employed to form the tantalum oxide in place of CVD method. In this case, the tantalum oxide film with better quality is obtained in the film formation step. Thus, the thermal treatment to oxidize the tantalum oxide can be omitted or conducted at the lower temperature. Moreover, single-layer or multi-layer dielectric film, which is composed of aluminum oxide film, hafnium oxide film or both, can be formed by atomic layer deposition method as the dielectric 308. In this case, there is an advantage that titanium nitride can be used for the lower electrode 307 in addition to the metals above mentioned.

As mentioned above, the upper electrode 309 is the single-layer titanium nitride film formed by CVD method. A multi-layer film, which includes a titanium nitride film formed by CVD method and a tungsten film formed by sputtering method, can be used as the upper electrode 309.

Second Embodiment

In a method for manufacturing the capacitor according to a second embodiment, a step of protecting the inside of the deep hole 600 by the photoresist is added to the method for manufacturing the capacitor according to the first embodiment. The additional step is conducted before the step of eliminating the overhang structure 601 by wet etching. In other words, the additional step is conducted before the step of widening the size L1 of the bore (hole width L1) in the opening portion.

Figure 5A:
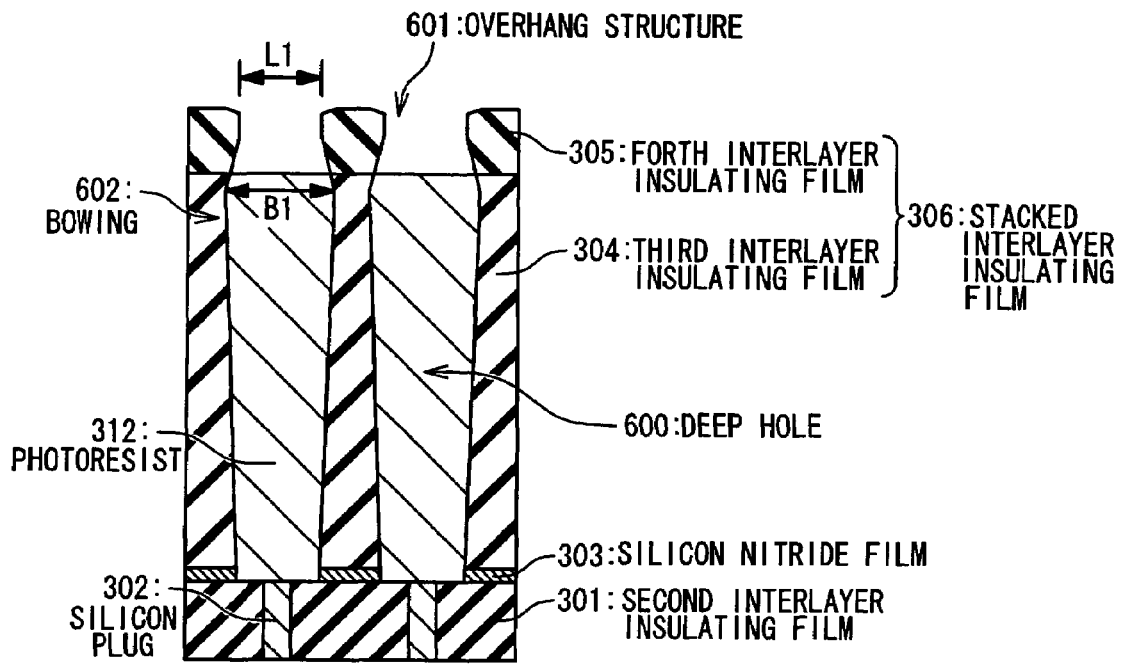
FIGS. 5A to 5C are cross sectional views of the capacitor portion showing a flow of a method of manufacturing a capacitor according to a second embodiment of the present invention.
Figure 5B:
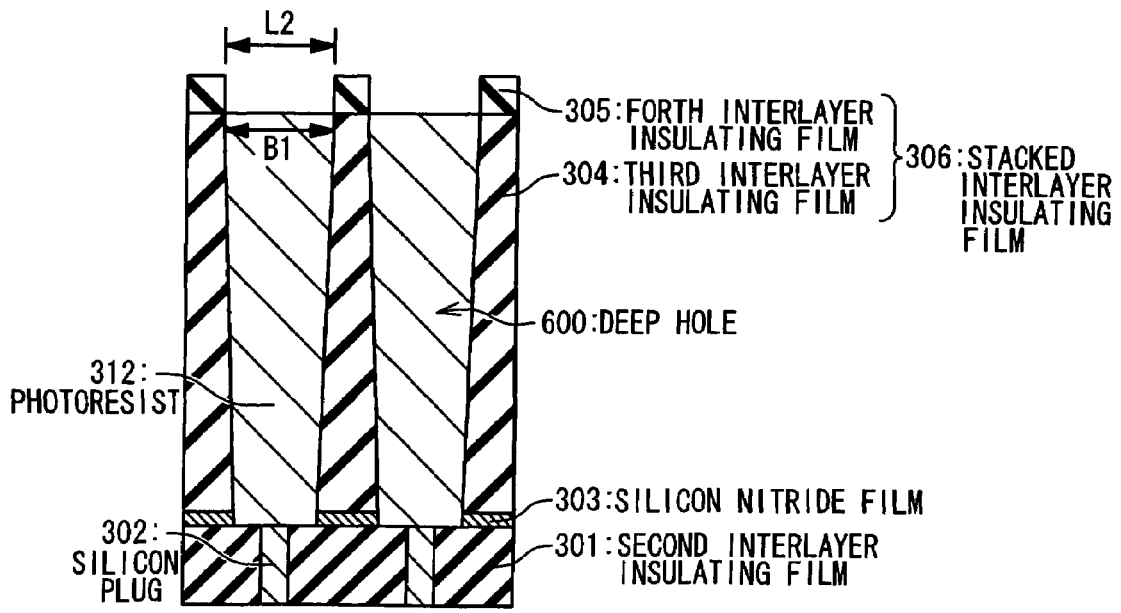
Figure 5C:
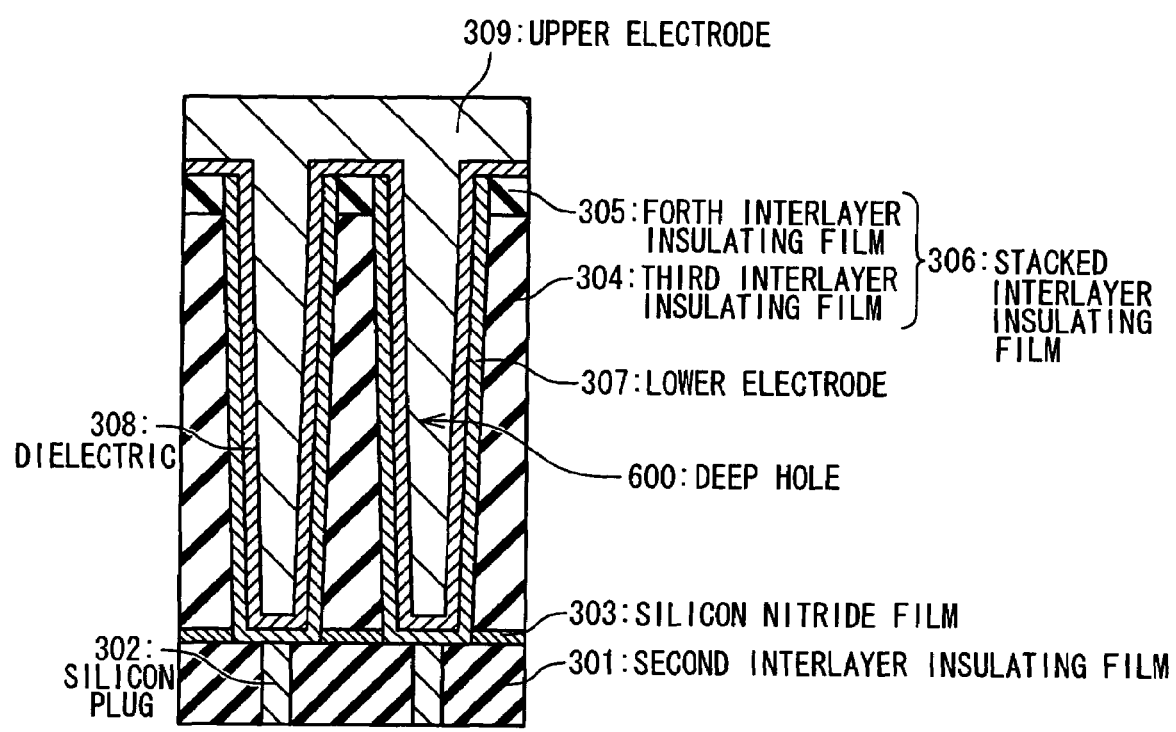

FIGS. 5A to 5C are cross sectional views of the capacitor portion 30 showing a series of flow for the manufacturing process of the capacitor portion 30 according to the second embodiment. Referring to FIGS. 5A to 5C, a method for manufacturing the capacitor according to the second embodiment will be explained below.

FIG. 5A shows the capacitor portion 30 in a state that the deep hole 600 is filled with the photoresist. According to the method shown in FIGS. 4A to 4D, the deep hole 600 with the bowing 602 is formed in the stacked interlayer insulating film 306 in which the forth interlayer insulating film 305 is stacked on the third interlayer insulating film 304. Next, the photoresist is coated by spin-coating method to completely fill in the deep hole 600. Following next is exposure and development processes to form the photoresist 312 to arrange the upper surface of the photoresist 312 at the position where the photoresist 312 covers completely a first portion of the inner surface (sidewall) of the deep hole 600 at the position of the maximum bore size (maximum hole width) B1 of the bowing 602 while not covering a second portion of the inner surface (sidewall). In other words, the photoresist 312 is a material, such as organic photoresist, formed to protect the first portion and not to protect the second portion. The photoresist 312 is formed not to cover the overhang structure 601 in the second portion. The inner surface (sidewall) of the deep hole is the sidewall of the stacked interlayer insulating film. The deep hole 600 is surrounded by the inner surface (sidewall). The widest portion of the deep hole 600 is surrounded by the first portion of the inner surface (sidewall). The opening portion of the deep hole 600 is surrounded by the second portion of the inner surface (sidewall). At this time, it is preferable that the deep hole 600 has the maximum bore size B1 at the position in the third interlayer insulating film 304 in the vicinity of the forth interlayer insulating film 305. It is preferable that the upper surface of the photoresist 312 is arranged at the position where the deep hole 600 has the maximum bore size B1.

Referring to FIG. 5B, the opening portion of the deep hole 600 with the overhang structure 601 is widened by wet etching after the formation of the photoresist 312. For the wet etching, hydrogen fluoride (HF) or hydrogen fluoride containing ammonium fluoride is used. In other words, hydrofluoric acid or hydrofluoric acid containing ammonium fluoride is used as etching liquid in the wet etching. In the wet etching, the widening of the maximum bore size B1 is prevented by the photoresist 312. Thus, the deep hole 600 is widened only in the opening portion with the overhang structure 602 of the deep hole 600. The widening of the deep hole 600 is position specific.

FIG. 5C shows the capacitor portion 30 in a state that the lower electrode 307, the dielectric 308 and the upper electrode 309 as the components of the capacitor are formed. The lower electrode 307, the dielectric 308 and the upper electrode 309 are formed in the same manner as the first embodiment. Thus, the explanation of the method for forming will be omitted.

In the first embodiment, the deep hole 600 is widened by the wet etching at the opening portion with the overhang structure 601 and at the portion of the bowing 602 where the deep hole 600 has the maximum bore size B1. Therefore, the condition of the wet etching is restricted in order to prevent the interconnection between the deep hole 600 and the adjacent deep hole in the portion where the deep hole 600 has the maximum bore size B1. Thus, the widening of the bore size of the opening portion of the deep hole 600 is also restricted.

In the second embodiment, since the maximum bore size B1 is not widened, the interconnection between the deep holes adjacent each other is certainly prevented. In the second embodiment, a wider bore size of the opening portion is available than in the first embodiment. In the second embodiment, there is an advantage of increased degree of freedom in the manufacturing method of the DRAM.

Third Embodiment

A method for manufacturing the capacitor according to a third embodiment is basically the same as the method for manufacturing the capacitor according to the first embodiment. In the third embodiment, the bowing of the deep hole, which is formed in the stacked interlayer insulating film 306 in the first embodiment, is formed in the hard mask. Then, the bowing and the overhang structure are eliminated by removing the hard mask in which the bowing and overhang structure are formed.

FIGS. 6A to 6F are cross sectional views of the capacitor portion 30 showing a series of flow for a manufacturing process of the capacitor portion 30 according to the third embodiment. Referring to FIGS. 6A to 6F, the method for manufacturing the capacitor according to the third embodiment will be explained below.

In the third embodiment, after the formation of the silicon plug 302, the silicon nitride film 303 is formed, followed by the formation of the stacked interlayer insulating film 306 including the third interlayer insulating film 304 and forth interlayer insulating film 305, in the same manner as the first embodiment. The third interlayer insulating film 304 is composed of silicon oxide deposited to have a thickness of 2700 nm. The forth interlayer insulating film 305 is deposited to have a thickness of 300 nm. The thickness of the stacked interlayer insulating film 306 is 3000 nm. The wet etching rate in the forth interlayer insulating film 305 is higher than that in the third interlayer insulating film 304.

Figure 6A:
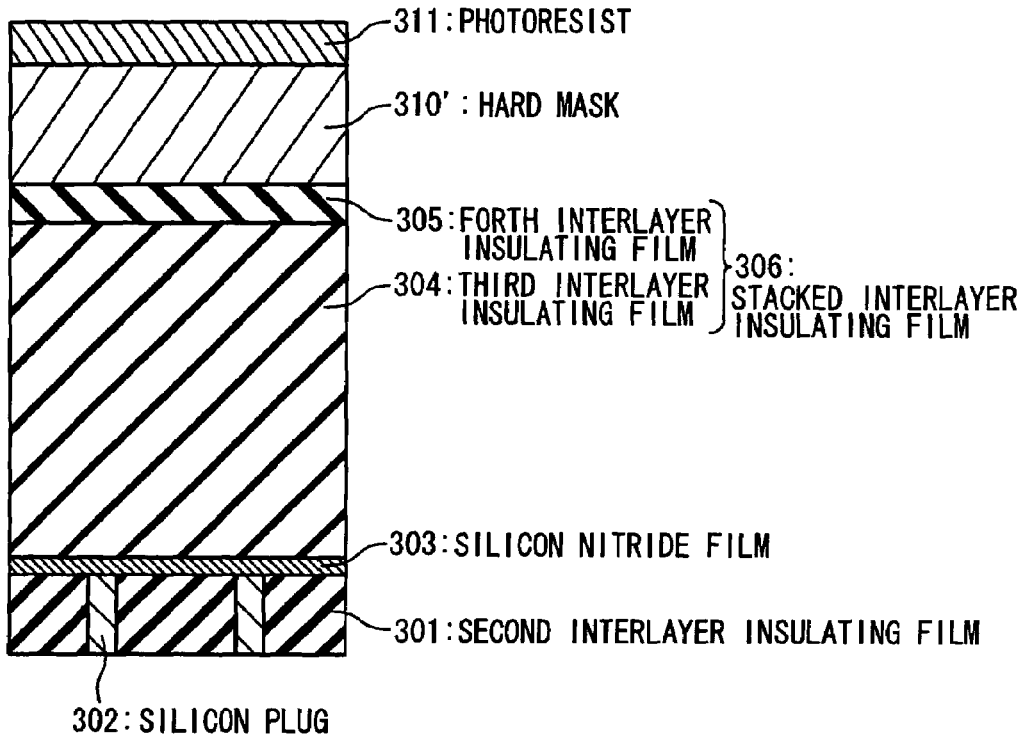
FIGS. 6A to 6F are cross sectional views of the capacitor portion showing a flow of a method of manufacturing a capacitor according to a third embodiment of the present invention.

Referring to FIG. 6A, a silicon film of 1000 nm thickness is deposited by CVD method as a hard mask 310'. The hard mask 310' in the third embodiment is deposited thicker than the hard mask 310 in the first embodiment. For the hard mask 310', an amorphous carbon film may be used in place of the silicone film. Next, the photoresist 311 is formed by spin-coating method on the hard mask 310'.

Figure 6B:
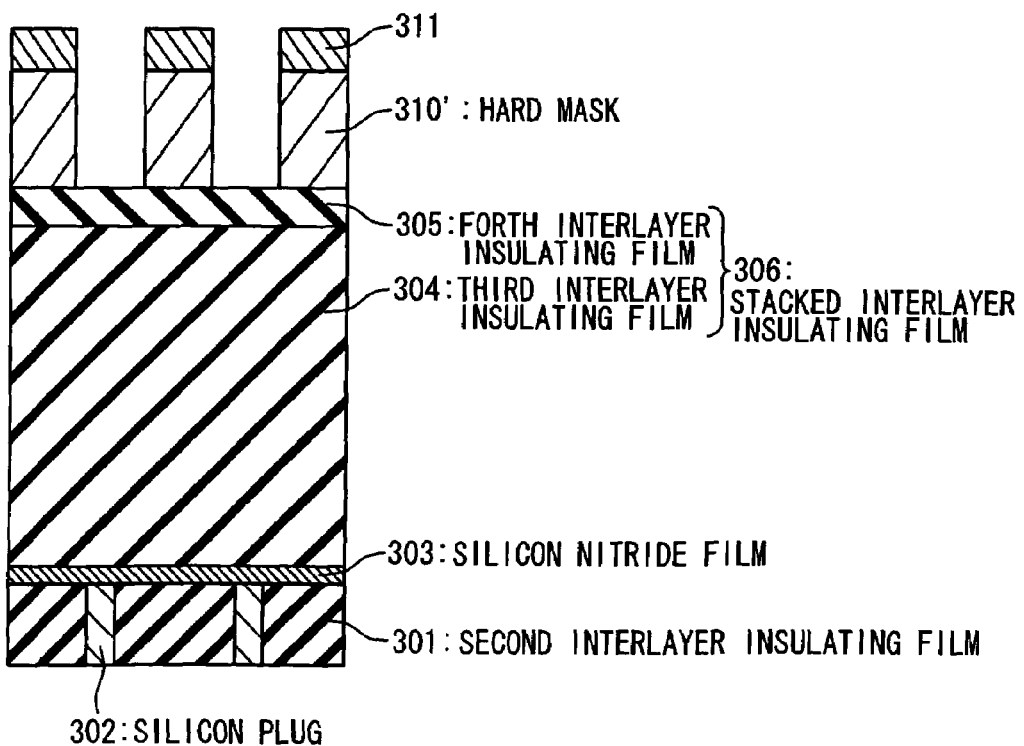

Referring to FIG. 6B, the silicon film is processed by lithography method and dry etching method to form the predetermined pattern of the opening in the hard mask 310' such that the upper surface of the forth interlayer insulating film 305 is exposed in the opening.

Figure 6C:
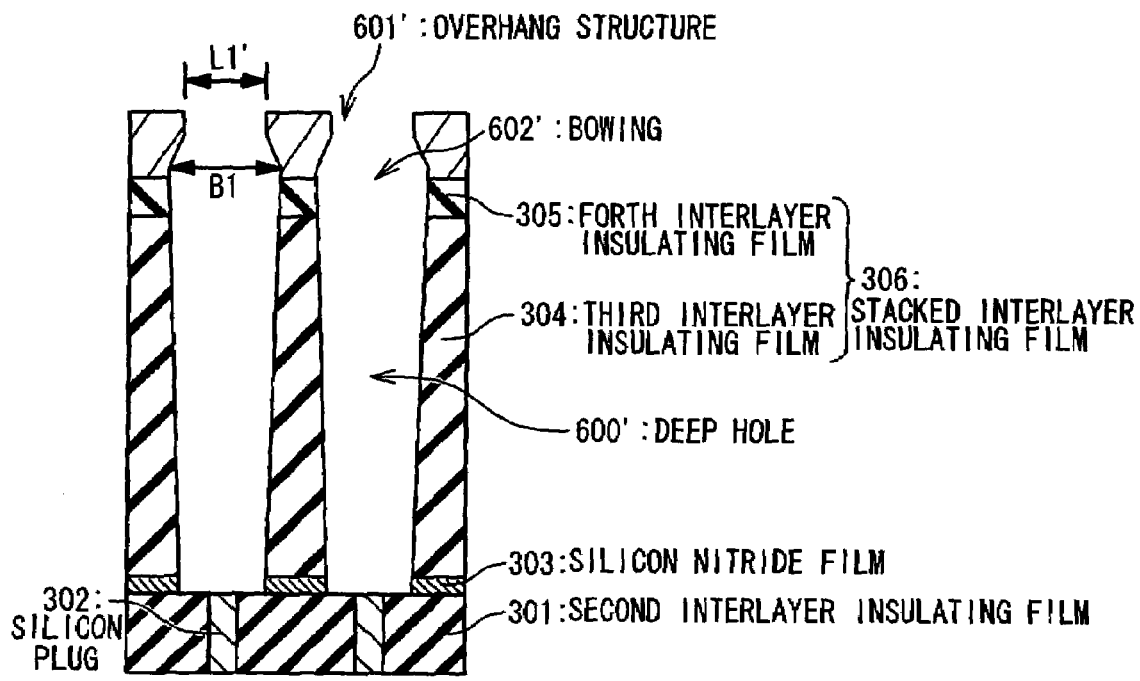

Referring to FIG. 6C, the stacked interlayer insulating film 306, which is composed of the third interlayer insulating film 304 and the fourth interlayer insulating film 305 stacked thereon, is subjected to anisotropic dry etching to form a deep hole 600'. For the dry etching of the stacked interlayer insulating film 306 containing silicon oxide, for example, an etching condition with a mixed gas of $C_5F_8$, Ar and $O_2$ as an etching gas, etching pressure of 100 mTorr and plasma power of 1500 W is applied to form the deep hole 600'. At this time, the deep hole 600' is formed such that a bowing 602' is generated in a position of sidewall of the hard mask 310'. In other words, the deep hole 600' is formed to have the bowing 602' in the hard mask 310'. It is considered that an increasing number of F ions are incident on the hard mask 310' obliquely to the substrate after recoil in the inclination generated in the shoulder of the hard mask 310' as the etching proceeds, and that the etching on the sidewall of the deep hole 600' in the vicinity of the opening portion by the recoiled F ions results in the formation of the bowing 602'. In the present embodiment, the hard mask 310' is thicker than the hard mask 310 of the first embodiment, thereby it is considered that the bowing 602' is generated in the sidewall of the deep hole 600' in the position in the hard mask 310'. The maximum bore size (maximum width) B1 in the bowing 602' is larger than the bore size (hole width) L1 in the opening portion of the deep hole 601'.

Figure 6D:
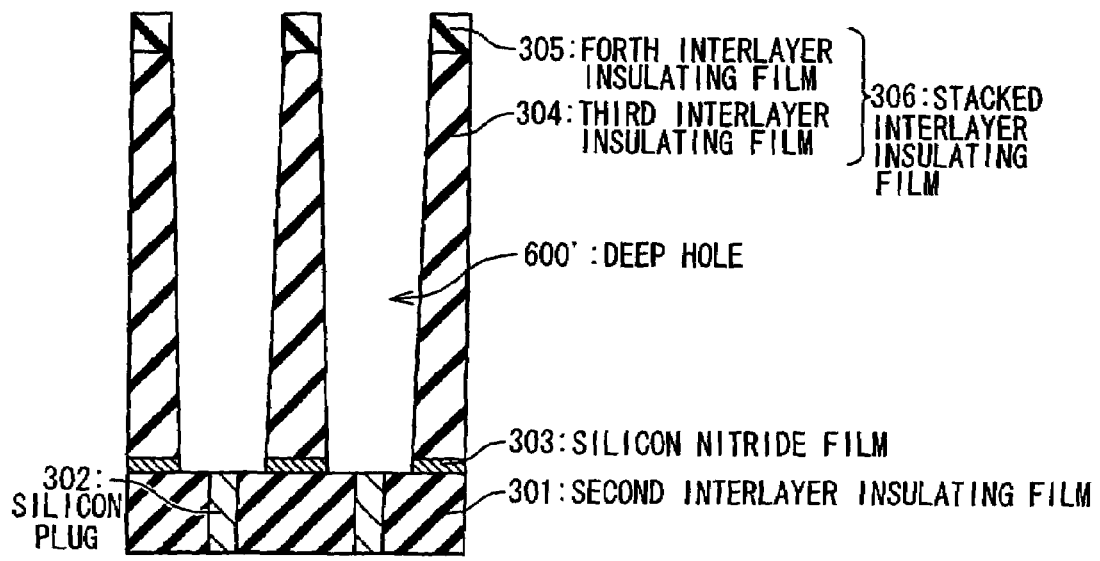

Referring to FIG. 6D, the overhang structure 601' and the bowing 602' are removed when the hard mask 310' is removed. An explanation of the method for removing the hard mask 310' will be omitted, since the method for removing the hard mask 310' is the same with that for removing the hard mask 310 in the first embodiment. In the third embodiment, the maximum width B1 of the bowing 602', which is necessarily generated in the formation of the deep hole 600', is positioned in the sidewall of the hard mask 310'. Therefore, after the removal of the hard mask 310', the deep hole 600' does not have the overhang structure in the opening portion but has a preferable tapered-shape with wide opening and narrow bottom. Therefore, in the third embodiment, the wet etching for widening the opening portion of the deep hole 600' may or may not be conducted. However, when the bowing 602' is generated in the vicinity of the fourth interlayer insulating film 304 and the overhang structure 601' remains in the fourth interlayer insulating film 305 after the removal of the hard mask 310', the remaining overhang structure 601' is preferably removed by the wet etching. At this time, the wet etching rate of the fourth interlayer insulating film 305 is preferably higher than that of the third interlayer insulating film 304.

Figure 6E:
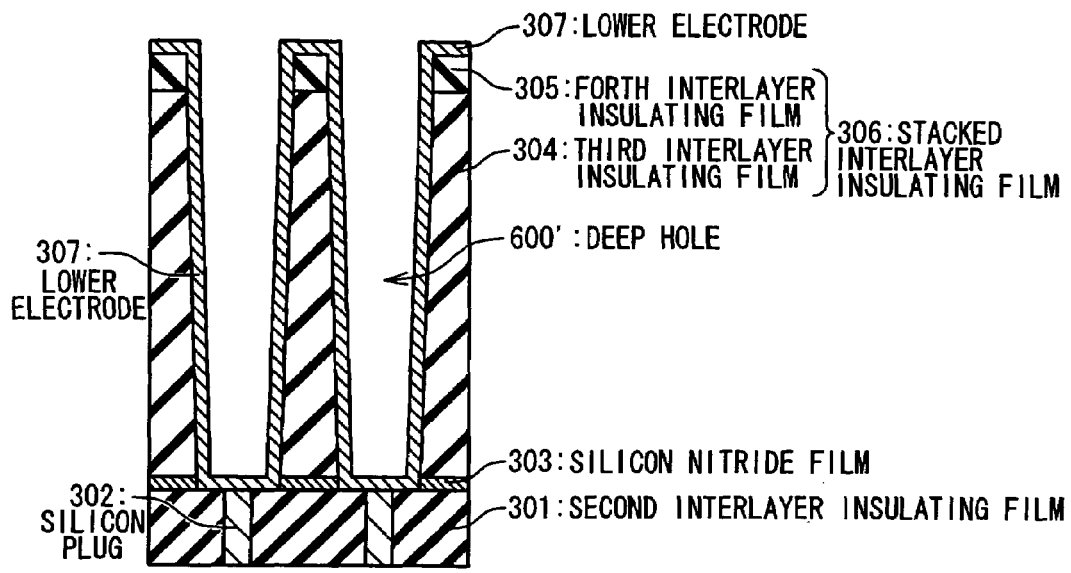

Referring to FIG. 6E, the lower electrode 307 is formed in the deep hole 600'. An explanation of a method for forming the lower electrode 307 will be omitted, since the method is the same with the method for forming the lower electrode 307 in the first embodiment.

Figure 6F:
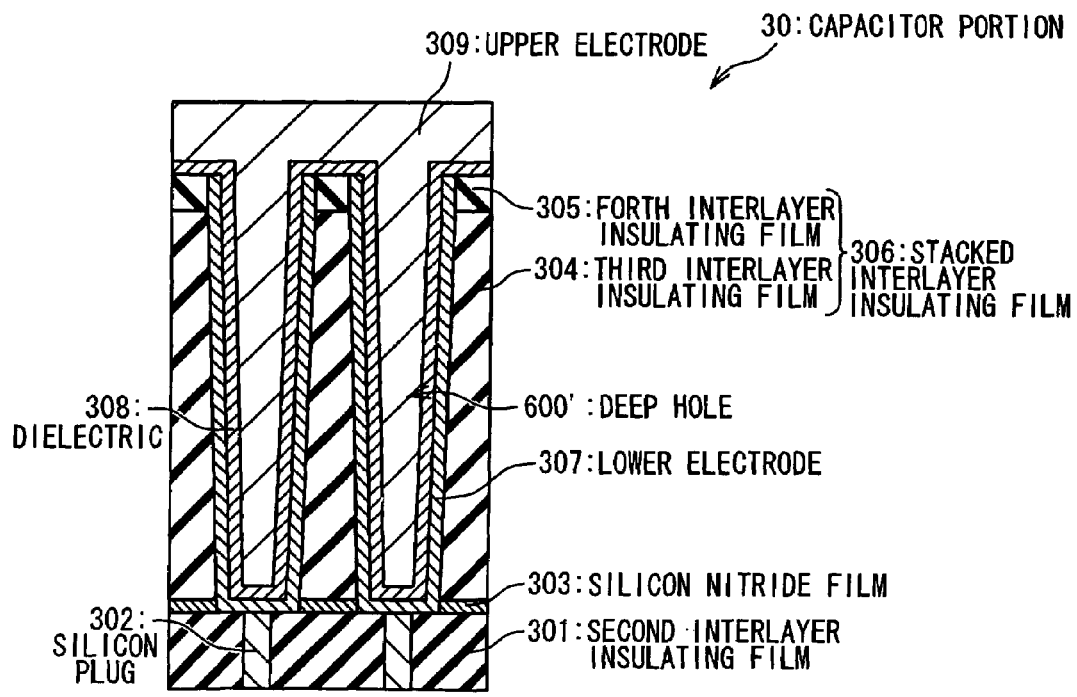

Referring to FIG. 6F, the dielectric 308 and the upper electrode 309 are formed on the lower electrode 307 to configure the capacitor. In the third embodiment, the deep hole 600' has the good shape without overhang structure. Therefore, the coverage by the dielectric 308 is prevented from being poor. Also, in the process of forming the upper electrode 309, the gap is prevented from being generated. Consequently, a capacitor with high reliability can be obtained.

As mentioned above, in the method for manufacturing the capacitor according to the present invention, it is possible to improve an overhang structure with a narrow opening portion of a deep hole caused by the bowing generated in formation of the deep hole. Therefore, a stacked capacitor provided in the deep hole can be manufactured without generating the gap in the deep hole. Moreover, a highly reliable stacked capacitor provided in the deep hole can be manufactured, since the deep hole has a preferable shape preventing a poor coverage by the dielectric film of the capacitor.

It is apparent that the present invention is not limited to the above embodiments, but may be modified and changed without departing from the scope and spirit of the invention.

What is claimed is:

1. A method for manufacturing a semiconductor device, comprising:
    depositing an interlayer insulating film on or above a plug connected to a switching element;
    forming a hole in said interlayer insulating film such that an opening portion of said hole is surrounded by an overhang structure and that said plug is exposed in a bottom of said hole;
    removing said overhang structure;
    forming a lower electrode of a capacitor on an inner surface of said hole;
    forming a dielectric on said lower electrode; and forming an upper electrode of the capacitor on said dielectric.

2. The method for manufacturing a semiconductor device, according to claim 1, wherein said hole is formed to have a bowing shape in which said hole has a maximum hole width, and wherein said overhang structure is removed such that a hole width of said hole in said opening portion after said removing is greater than said maximum hole width.

3. The method for manufacturing a semiconductor device, according to claim 1, wherein said depositing said interlayer insulating film comprises:

depositing a first interlayer insulating film on or above said plug; and depositing a second interlayer insulating film on said first interlayer insulating film, wherein an etching rate of said second interlayer insulating film is greater than an etching rate of said first interlayer insulating film upon wet etching with a predetermined condition, and wherein said removing said overhang structure comprises etching said overhang structure by wet etching method with said predetermined condition.

4. The method for manufacturing a semiconductor device, according to claim 1, wherein said removing said overhang structure comprises:

forming a member in said hole to protect a first portion of a sidewall and not to protect a second portion of said sidewall; and removing said second portion, wherein said hole is surrounded by said sidewall, and wherein said opening portion is surrounded by said second portion.

5. The method for manufacturing a semiconductor device, according to claim 4, wherein said member is formed to cover said first portion and not to cover said overhang structure, and wherein a widest portion of said hole is surrounded by said first portion.

6. The method for manufacturing a semiconductor device, according to claim 4, wherein said member comprises an organic photoresist film.

7. The method for manufacturing a semiconductor device, according to claim 1, wherein said forming said hole comprises:

forming a hard mask on said interlayer insulating film;

removing a portion of said hard mask; and forming said hole to have a bowing shape, arranged in said hard mask, in which said hole has a maximum hole width, and wherein said removing said overhang structure comprises removing said hard mask.

8. The method for manufacturing a semiconductor devices according to claim 1, wherein said depositing said interlayer insulating film comprises:

depositing a first interlayer insulating film of a first material on or above said plug; and depositing a second interlayer insulating film of a second material on said first interlayer insulating film, wherein an etching rate of said second material is greater than an etching rate of said first material upon wet etching with a predetermined condition, and wherein said removing said overhang structure comprises etching said overhang structure by wet etching method with said predetermined condition.

9. A method of manufacturing a semiconductor device, comprising:

depositing an interlayer insulating film on a semiconductor substrate, said depositing said interlayer insulating film comprising:

depositing a first interlayer insulating film; and depositing a second interlayer insulating film on said first interlayer insulating film;

forming a hole in said interlayer insulating film such that a top portion of the hole has an inner surface in a shape of an overhang; and removing said top portion of the hole, wherein an etching rate of said second interlayer insulating film is greater than an etching rate of said first interlayer insulating film upon wet etching, and wherein said removing the top portion of the hole comprises removing a top portion of the second interlayer insulating film by the wet etching.

* * * * *